(12) United States Patent
Wei et al.

(10) Patent No.: US 9,187,319 B2
(45) Date of Patent: Nov. 17, 2015

(54) SUBSTRATE ETCHING METHOD AND SUBSTRATE PROCESSING DEVICE

(75) Inventors: Gang Wei, Beijing (CN); Chun Wang, Beijing (CN); Dongsan Li, Beijing (CN)

(73) Assignee: BEIJING NMC CO., LTD., Beijing (CN)

(*) Notice: Subject to any disclaimer, the term of this patent is extended or adjusted under 35 U.S.C. 154(b) by 0 days.

(21) Appl. No.: 14/366,488

(22) PCT Filed: Jun. 4, 2012

(86) PCT No.: PCT/CN2012/076427
§ 371 (c)(1),
(2), (4) Date: Jun. 18, 2014

(87) PCT Pub. No.: WO2013/091354
PCT Pub. Date: Jun. 27, 2013

(65) Prior Publication Data
US 2014/0363975 A1 Dec. 11, 2014

(30) Foreign Application Priority Data
Dec. 19, 2011 (CN) .......................... 2011 1 0424013

(51) Int. Cl.
| H01L 21/311 | (2006.01) |
| B81C 1/00 | (2006.01) |
| H01L 21/3065 | (2006.01) |
| B81C 99/00 | (2010.01) |

(52) U.S. Cl.
CPC .......... *B81C 1/00531* (2013.01); *B81C 99/0025* (2013.01); *H01L 21/30655* (2013.01)

(58) Field of Classification Search
CPC ............ H01L 21/3065; H01L 21/30655; H01L 21/31116; H01J 37/32192; H01J 37/32706; H01J 37/3408; H01J 37/3467
USPC .................. 216/37, 67; 438/694, 695, 696
See application file for complete search history.

(56) References Cited

U.S. PATENT DOCUMENTS

| 6,051,503 A | * | 4/2000 | Bhardwaj et al. ............. 438/705 |
| 6,133,153 A | * | 10/2000 | Marquez et al. ............. 438/706 |

(Continued)

FOREIGN PATENT DOCUMENTS

| CN | 101958244 A | 1/2011 |
| CN | 101988196 A | 3/2011 |

(Continued)

OTHER PUBLICATIONS

International Search Report of PCT/CN2012/076427 dated Oct. 4, 2012.

*Primary Examiner* — Shamim Ahmed
(74) *Attorney, Agent, or Firm* — Locke Lord LLP; Howard M. Gitten

(57) ABSTRACT

A substrate etching method and a substrate processing device, the substrate etching method includes: S1: placing a substrate to be processed into a reaction chamber; S2: supplying etching gas into the reaction chamber; S3: turning on an excitation power supply to generate plasma in the reaction chamber; S4: turning on a bias power supply to apply bias power to the substrate; S5: turning off the bias power supply, and meanwhile, starting to supply deposition gas into the reaction chamber; S6: stopping supply of the deposition gas into the reaction chamber, and meanwhile, turning on the bias power supply; S7: repeating steps S5-S6, until the etching process is completed. In the whole etching process, the etching operation is always performed, and the deposition operation is performed sometimes. Therefore, during the deposition operation, the plasma in the reaction chamber can etch away at least a part of deposited polymers formed by the deposition operation on a sidewall of an etched section, so that the sidewall of the etched section of the substrate is smooth.

17 Claims, 3 Drawing Sheets

(56) References Cited

U.S. PATENT DOCUMENTS

2004/0188239 A1* 9/2004 Robison et al. ............ 204/192.3
2005/0211668 A1* 9/2005 Pandhumsoporn ............. 216/59
2009/0272717 A1* 11/2009 Pamarthy et al. ............... 216/37

FOREIGN PATENT DOCUMENTS

| CN | 101988197 A | 3/2011 |
| CN | 102165565 A | 8/2011 |
| CN | 102187437 A | 9/2011 |

* cited by examiner

SUBSTRATE ETCHING METHOD AND SUBSTRATE PROCESSING DEVICE

COSS-REFERENCE TO RELATED APPLICATIONS

This application is the national phase under 35 U.S.C. §371 of PCT International Application No. PCT/CN2012/076427 filed Jun. 4, 2012, which claims the benefit of China patent Application No. 2011-10424013.8, filed Dec. 19, 2011, the entire contents of the aforementioned applications are hereby incorporated herein by reference.

FIELD OF THE INVENTION

The present invention relates to the field of microelectronics technology, and particularly relates to a substrate etching method and a substrate processing device.

BACKGROUND OF THE INVENTION

As MEMS devices and MEMS systems are widely used in the field of automobile and consumer electronics, and through-silicon via (TSV) etch technology has wide prospect in the field of packaging, plasma deep silicon dry etching process gradually becomes one of the most important processes in the field of MEMS manufacturing and TSV technology.

Deep silicon etching process is different from a general silicon etching process in that: etching depth of the deep silicon etching process is much larger than that of the general silicon etching process and is generally several tens of micrometers or even up to one hundred meters, and however etching depth of the general silicon etching process is smaller than 1 micrometer. In order to etch a silicon material of several tens of micrometers, the deep silicon etching process is required to have a larger etching rate, a higher selection ratio and a larger aspect ratio.

Currently, a popular deep silicon etching process is Bosch process invented by Bosch in Germany or improvements on it. The main features of Bosch process are: the whole etching procedure is multiple repetitions of one circulation unit and the circulation unit includes an etching operation and a deposition operation, that is, the whole etching procedure is alternate circulation of the etching operation and the deposition operation. Process gas used in the etching operation is $SF_6$, which allows a higher etching rate of a silicon substrate. In practical application, since the etching procedure is isotropic etching, it is difficult to control sidewall morphology. So, in order to avoid etching of the sidewall, the deposition is incorporated in the whole etching procedure to deposit a layer of polymer protection film on the sidewall to protect the sidewall from being etched, so as to etch only in the vertical direction.

The defects in the prior art are: since the etching operation and the deposition operation are performed alternately, the polymer deposited on the sidewall of the etched section is not smooth, and so the product resulted from such an etching is not ideal.

SUMMARY OF THE INVENTION

The invention aims to solve at least one of the problems existing in the prior art.

The object of the invention is intended to solve at least one of the above defects, and particularly to solve the problem that the sidewall of the etched section is not smooth and the process result is not ideal.

In order to achieve the object, one aspect of the invention provides a substrate etching method, including steps of: S1: placing a substrate to be processed in a reaction chamber; S2: supplying etching gas into the reaction chamber; S3: turning on an excitation power supply to generate plasma in the reaction chamber; S4: turning on a bias power supply to apply bias power to the substrate; S5: turning off the bias power supply, and meanwhile, starting to supply deposition gas into the reaction chamber; S6: stopping supply of the deposition gas into the reaction chamber, and meanwhile, turning on the bias power supply; and S7: repeating steps S5-S6, until the etching process is completed.

In an embodiment of the invention, with the progress of process, during each period in which the bias power supply is turned on, the power of the bias power supply, the flow rate of the etching gas, and/or the power of the excitation power supply are kept constant or increased gradually; and/or during each period in which the bias power supply is turned off, the flow rate of the deposition gas, the flow rate of the etching gas, and/or the power of the excitation power supply are kept constant or decreased gradually.

In an embodiment of the invention, with the progress of process, as for two adjacent periods in which the bias power supply is turned on, the power of the bias power supply, the flow rate of the etching gas and/or the power of the excitation power supply during the latter period in which the bias power supply is turned on are equal to or larger than those during the former period in which the bias power supply is turned on; and/or as for two adjacent periods in which the bias power supply is turned off, the flow rate of the deposition gas, the flow rate of the etching gas and/or the power of the excitation power supply during the latter period in which the bias power supply is turned off are equal to or smaller than those during the former period in which the bias power supply is turned off.

In an embodiment of the invention, with the progress of process, the switching frequency of ON/OFF of the bias power supply is increased gradually, and the switching frequency of connection/disconnection of the deposition gas is increased correspondingly.

In an embodiment of the invention, with the progress of process, the switching frequency of power levels of the excitation power supply is gradually increased, and/or the switching frequency of flow rates of the etching gas is gradually increased.

In an embodiment of the invention, when the bias power supply is turned on, a fixed matching method or a method combining fixed matching and frequency scanning is used to achieve impedance matching of the excitation power supply and the bias power supply, respectively.

In an embodiment of the invention, the excitation power supply is a radio frequency power supply.

Another aspect of the invention further provides a substrate processing device, including: a reaction chamber; an etching gas controller, for switching on or switching off an etching gas path for supplying etching gas into the reaction chamber and adjusting flow rate of the etching gas; an excitation power supply, for applying radio frequency power to the etching gas in the reaction chamber to generate plasma in the reaction chamber, a bias power supply, for applying bias power to a substrate; a deposition gas controller, for switching on or switching off a deposition gas path for supplying deposition gas into the reaction chamber and adjusting the flow rate of the deposition gas; and a central controller, connected with the etching gas controller, the excitation power supply, the bias power supply and the deposition gas controller, respectively, and for performing at least the following operations: controlling the etching gas controller to switch on or switch off the etching gas path and adjusting the flow rate of the etching gas; controlling turning-on or turning-off of the excitation power supply and adjusting the radio frequency power of the excitation power supply; controlling turning-on or turning-off of the bias power supply, and adjusting the bias power of the bias power supply; and controlling the deposition gas controller to switch on or switch off the deposition gas path and adjusting the flow rate of the deposition gas; wherein the central controller controls the excitation power supply to be kept in a turn-on state, controls the etching gas controller to keep the etching gas path in a switch-on state, controls the deposition gas path to be switched off while the bias power supply is turned on, and controls the deposition gas path to be switched on while the bias power supply is turned off throughout the substrate etching process.

In an embodiment of the invention, with the progress of process, the central controller controls the etching gas controller to adjust the flow rate of the etching gas, and/or the central controller controls the power of the excitation power supply and/or the power of the bias power supply so that during each period in which the bias power supply is turned on, the flow rate of the etching gas, the power of the excitation power supply and/or the power of the bias power supply are kept constant or increased gradually; and/or the central controller controls the etching gas controller to adjust the flow rate of the etching gas, the central controller controls the deposition gas controller to adjust the flow rate of the deposition gas, and/or the central controller controls the power of the excitation power supply so that during each period in which the bias power supply is turned off, the flow rate of the etching gas, the flow rate of the deposition gas, and/or the power of the excitation power supply are kept constant or decreased gradually.

In an embodiment of the invention, with the progress of process, the central controller controls the etching gas controller to adjust the flow rate of the etching gas, and/or the central controller controls the power of the excitation power supply and/or the power of the bias power supply so that during two adjacent periods in which the bias power supply is turned on, the flow rate of the etching gas, the power of the excitation power supply, and/or the power of the bias power supply during the latter period in which the bias power supply is turned on are equal to or larger than those during the former period in which the bias power supply is turned on; and/or the central controller controls the etching gas controller to adjust the flow rate of the etching gas, the central controller controls the deposition gas controller to adjust the flow rate of the deposition gas, and/or the central controller controls the power of the excitation power supply so that during two adjacent periods in which the bias power supply is turned off, the flow rate of the etching gas, the flow rate of the deposition gas and/or the power of the excitation power supply during the latter period in which the bias power supply is turned off are equal to or smaller than those during the former period in which the bias power supply is turned off.

In an embodiment of the invention, the central controller controls the switching frequency of ON/OFF of the bias power supply to be increased gradually with the progress of process, and the central controller controls the deposition gas controller so that the switching frequency of connection/disconnection of the deposition gas path is increased as the switching frequency of ON/OFF of the bias power supply is increased.

In an embodiment of the invention, the central controller controls the switching frequency of ON/OFF of the excitation power supply to be increased gradually with the progress of process; and/or the central controller controls the etching gas controller so that the switching frequency of connection/disconnection of the etching gas path is increased with the progress of process.

In an embodiment of the invention, when the bias power supply is turned on, the central controller controls impedance matching of the excitation power supply and the bias power supply, respectively, and a method to achieve the impedance matching is a fixed matching method or a method combining fixed matching and frequency scanning.

In an embodiment of the invention, the excitation power supply is a radio frequency power supply.

In an embodiment of the invention, the etching gas is at least one of fluorine based etching gas, chlorine based etching gas, and bromine based etching gas.

In an embodiment of the invention, the fluorine based etching gas includes $CF_4$ and $SF_6$, the chlorine based etching gas includes $Cl_2$, $BCl_3$, $SiCl_4$, $SiCl_2H_2$, and the bromine based etching gas includes $Br_2$ and $HBr$.

In an embodiment of the invention, the deposition gas is at least one of $C_4F_8$, $C_2F_4$, $C_2H_2F_2$ and $CCl_4$.

In the substrate etching method and the substrate processing device provided by the embodiments of the invention, throughout the whole substrate etching process, the etching gas is always supplied into the reaction chamber and the excitation power supply is always kept in a turn-on state, whereby the etching operation is always performed throughout the whole process and the deposition operation is sometimes performed so that a single etching operation mode and a combined operation mode, in which the etching operation and the deposition operation are performed simultaneously, are circulated alternately. Thus, when the combined operation mode is performed, the substrate is etched by plasma in the reaction chamber at the same time the deposition operation is performed so that at least a part of deposited polymers formed by the deposition operation on a sidewall of an etched section are etched away, thus causing the sidewall of the etched section of the substrate smooth and then increasing process quality of the substrate.

Moreover, by supplying etching gas into the reaction chamber and keeping the excitation power supply to be in a turn-on state throughout the whole process, the process parameters (such as power of the excitation power supply, kinds of gas, etching gas and gas pressure) may be adjusted conveniently during the process and the process can reach a stable state rapidly, increasing the process performance.

In addition, in the embodiments of the present invention, different process parameters can be adjusted synchronously, for example, feeding of deposition gas and turning off of the bias power supply may be performed synchronously; as another example, stop feeding of deposition gas and turning on of the bias power supply may be performed synchronously. Compared with the existing Bosch process in which different process parameters can be adjusted sequentially, the invention can save time required to adjust process parameters, thus increasing efficiency of the process.

Additional aspects and advantages of the invention will be set forth in the following description, part thereof will be apparent from the following description, or will be known from the practice of the invention.

BRIEF DESCRIPTION OF THE DRAWINGS

The above and/or additional aspects and advantages of the invention will become apparent and be understood easily from the following descriptions of embodiments in conjunction with accompanying drawings, in which.

DETAILED DESCRIPTION OF THE EMBODIMENTS

Figure 1:
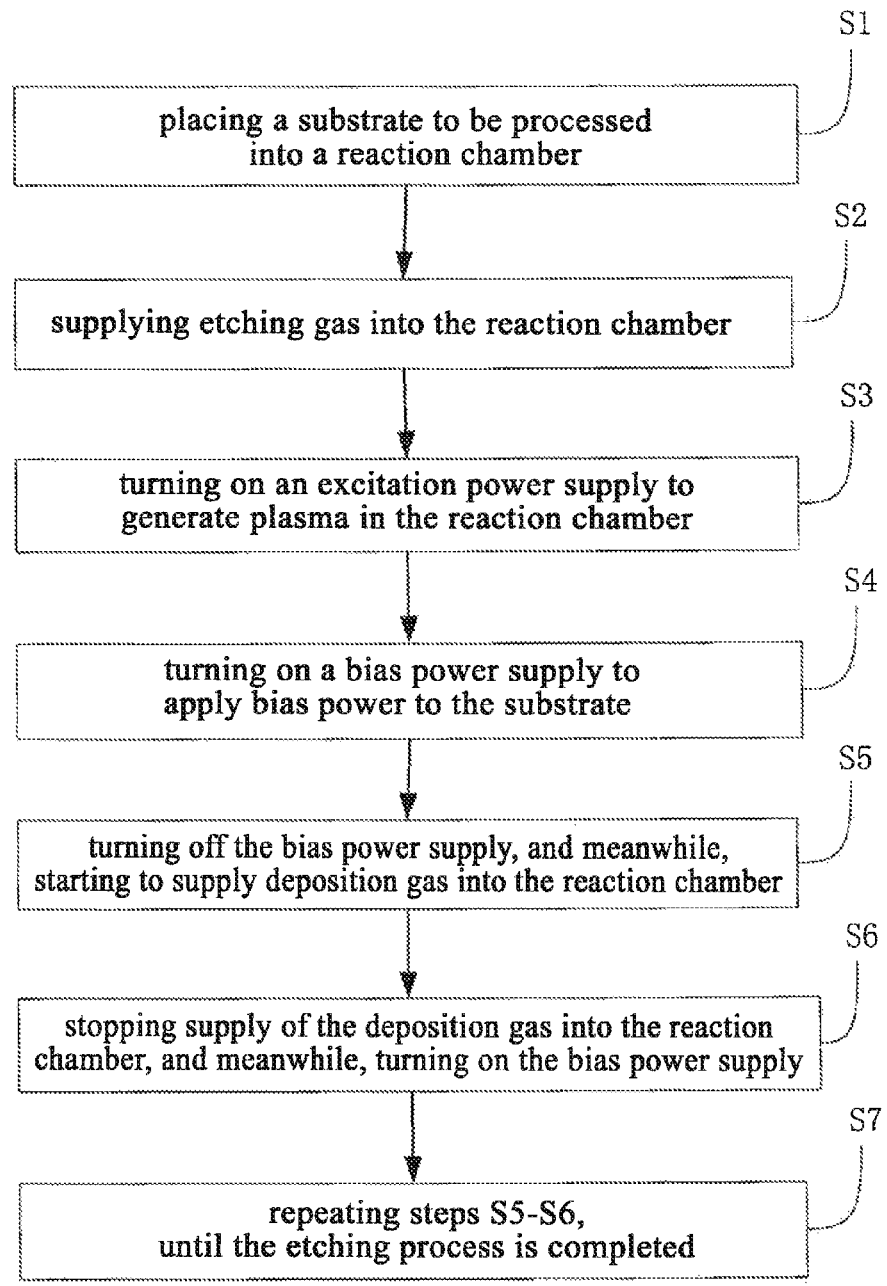
FIG. 1 is a flowchart of a substrate etching method according to an embodiment of the invention.

The following will describe embodiments of the invention in detail and examples of the embodiments are illustrated in the accompanying drawings, wherein like or similar reference numerals indicate like or similar elements or elements with like or similar functions throughout the description. The embodiments described below referring to the drawings are exemplary, are only used to explain the invention and are not intended to limit the invention.

The following disclosure provides various embodiments or examples to implement various structures of the invention. In order to simply the disclosure, components and configurations of specific examples will be described in the following. Of course, they are merely examples and are not intended to limit the invention. In addition, the invention may refer to numbers and/or letters repeatedly in different examples. Such a repetition is intended to simplify and clarify, and does not indicate relationship between the discussed various embodiments and/or configurations. In addition, the invention provides examples with various specific processes and materials. However, persons skilled in the art should understand that the invention may be also applicable to other processes and/or other materials. In addition, the following structure, in which the first feature is "on" the second feature, may include an embodiment in which the first and second features are formed to be in direct contact with each other, or may include an embodiment in which another feature is formed between the first feature and the second feature, which may result in the fact that the first and second features are not in direct contact with each other.

In the description of the invention, it should be understood that, orientation or position relationship indicated by terms "longitudinally", "laterally", "above", "under", "front", "behind", "left", "right", "vertically", "horizontally", "top", "bottom", "inside", "outside" etc. is based on the orientation or the position relationship shown in the Figure and these terms are used to facilitate and simplify description of the invention, and are not intended to indicate or imply that the mentioned device or element must have the specific orientation, and configure and operate at the specific orientation, so they should not be understood to limit the invention.

In the description of the invention, it should be noted that, unless otherwise regulated and defined, terms "install", "connect" and "joint" should be understood in a generalized meaning, for example, it may be mechanical connection or electrical connection, may be communication between interiors of two elements, may be connected directly, or may be connected via a medium element, and persons skilled in the art may understand the above terms based on the particular situation.

FIG. 1 is a flow chart of a substrate etching method provided by an embodiment of the invention. According to the embodiment of the invention, throughout the whole substrate etching process, the etching plasma is kept to always exist in the reaction chamber (that is, the etching operation is always performed), and throughout the whole etching process, the deposition operation is performed sometimes, so that a single operation mode and a combined operation mode are circulated alternately. Herein, the single operation mode means that only the etching operation exists, which may also be referred to as a single etching operation mode; the combined operation mode means that the etching operation and the deposition operation exist simultaneously, which may also referred to as a combined operation mode in which the etching operation and the deposition operation coexist. In practical application, various conditions required in the deposition operation may be achieved synchronously, for example, the supply of the deposition gas and the turning off the bias power supply may be achieved synchronously.

The substrate etching method provided by the embodiment of the invention will be described in detail in the following. In particular, the method includes:

Step S1, placing a substrate to be processed into a reaction chamber. In an example of the invention, the substrate to be processed is a Si chip.

Step S2, supplying etching gas into the reaction chamber. It should be pointed out that, throughout the whole process of the substrate etching method provided by the embodiment of the invention, etching gas is always supplied into the reaction chamber. In an example of the invention, the etching gas is at least one of fluorine based etching gas, chlorine based etching gas, and bromine based etching gas. The fluorine based etching gas includes $CF_4$ and $SF_6$, the chlorine based etching gas includes $Cl_2$, $BCl_3$, $SiCl_4$, $SiCl_2H_2$, and the bromine based etching gas includes $Br_2$ and $HBr$. In the following description, use of the fluorine based etching gas $SF_6$ is taken as an example.

Step S3, turning on an excitation power supply (for example, a RF power supply), to generate plasma in the reaction chamber. It should be pointed out that, throughout the whole process, the etching gas is always supplied into the reaction chamber and the excitation power supply is always kept to be in a turn-on state, so as to generate plasma in the reaction chamber always, and then to perform the etching operation throughout the whole process so that plasma in the reaction chamber may still perform a certain etching on the substrate when the deposition operation is performed.

Step S4, turning on the bias power supply to apply a bias power to the substrate to be processed. By applying the bias power, the plasma may be caused to perform etching on the substrate to be processed.

Step S5, turning off the bias power supply and meanwhile, supplying deposition gas into the reaction chamber. In an example of the invention, the deposition gas may be at least one of $C_4F_8$, $C_2F_4$, $C_2H_2F_2$ and $CCl_4$. In the following, the $C_4F_8$ is taken as an example.

Step S6, stopping supply of the deposition gas into the reaction chamber and meanwhile, turning on the bias power supply.

Step S7, repeating steps S5-S6 until the etching process is completed.

In the substrate etching method provided by the embodiment of the invention, throughout the whole substrate etching process, there always exists plasma in the reaction chamber (that is, etching operation is always performed in the reaction chamber) and the deposition operation is sometimes inserted into the etching process so that a single etching operation mode and a combined operation mode, in which the etching operation and the deposition operation coexist, are circulated alternately. When the combined operation mode is performed, the substrate may be etched by plasma in the reaction chamber while the deposition operation is performed so that at least a part of deposited polymers formed by the deposition operation on a sidewall of an etched section are etched away, to make the sidewall of the etched section of the substrate smooth, increasing process quality of the substrate. In addition, by supplying etching gas into the reaction chamber and keeping the excitation power supply to be in a turn-on state throughout the whole process, the process parameters (such as power of the excitation power supply, kinds of gas, etching gas and gas pressure) may be adjusted conveniently during the process and the process can reach a stable state rapidly, increasing the process performance.

Preferably, the respective impedance matching methods for the excitation power supply and the bias power supply may include a fixed matching method and a method combining fixed matching and frequency scanning. In particular, when the fixed matching method is adopted, the impedance matching point of the impedance matcher is preset (that is, the capacitance of an adjustable capacitor inside the impedance matcher is set), and the matching is achieved using the impedance matcher with the set impedance matching point in the process so that reflected power of the excitation power supply and the bias power supply are reduced to desirable values. In other words, in this method, the capacitance of the adjustable capacitor inside the impedance matcher is preset in an off-line state so that the respective matching of the excitation power supply and the bias power supply may be achieved without adjusting the capacitance of the adjustable capacitor inside the impedance matcher again in the process, thus saving the matching time for the excitation power supply and the bias power supply, and the efficiency of the process is increased. When the method combining fixed matching and frequency scanning is adopted, a respective impedance matcher set with a proper impedance matching point is used to match the excitation power supply and the bias power supply. If in the process the reflected power of the excitation power supply and the bias power supply is larger due to the factors such as improper set impedance matching point, the frequency scanning method is further utilized to adjust frequencies of the excitation power supply and the bias power supply, that is, in practice, the frequencies of the excitation power supply and the bias power supply are adjusted according to magnitudes of the reflected power of the excitation power supply and the bias power supply, until the reflected power of the excitation power supply and the bias power supply are reduced to desirable values, so that respective matching of the excitation power supply and the bias power supply are achieved. In practical application, when the method combining fixed matching and frequency scanning is used, since the excitation power supply and the bias power supply can be frequency scanned with a high speed, the matching of the excitation power supply and the bias power supply can be achieved rapidly using the method combining fixed matching and frequency scanning, to save the matching time and then increase efficiency of the process. In addition, in the process, since power, kinds and flow rate of gas are all changeable, the gas pressure may be balanced soon by controlling the position of the swing valve (butterfly valve), thus increasing the efficiency and stability of the process.

The invention will be described using particular embodiments below. However, it should be pointed out that, the following embodiments are only preferable embodiments and do not mean that the invention can be implemented only using the below embodiments. Persons skilled in the art may make equivalent modifications or changes to the following embodiments of the invention and these equivalent modifications or changes should be included in the protection scope of the invention.

Figure 2:
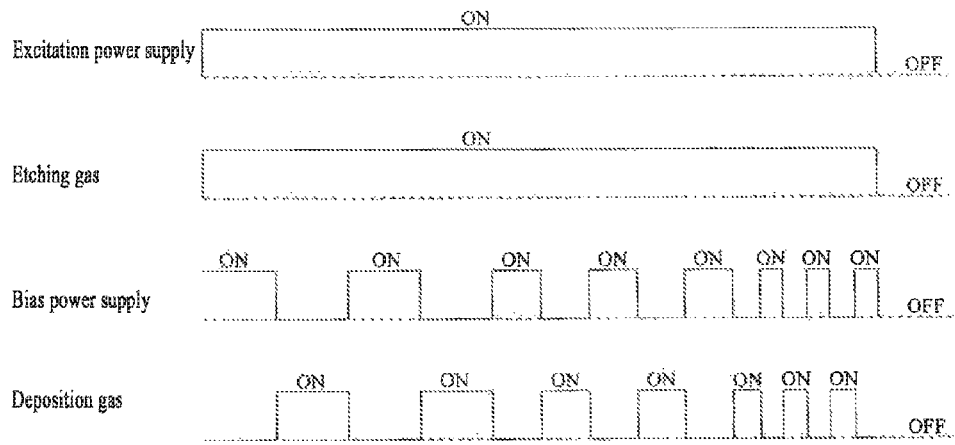
FIG. 2 is a timing diagram illustrating ON/OFF of an excitation power supply, an etching gas, a bias power supply and a deposition gas according to an embodiment of the invention.

FIG. 2 is a timing diagram illustrating ON/OFF of the excitation power supply, the etching gas, the bias power supply and the deposition gas according to an embodiment of the invention. The description is made taking the deep silicon etching process as an example. When performing the deep silicon etching process, the excitation power supply is used to generate high density plasma, the radio frequency (RF) of the used excitation power supply is generally 13.56 MHz, or may be 27.12 MHz, 40 MHz or other frequency, and the power of the excitation power supply is generally 1000 W to 6000 W, preferably 2000 W to 5000 W. During the whole process, the etching operation is always performed, that is, the excitation power supply which generates the high density plasma is always kept to be turned on and always supplies etching gas ($SF_6$ gas) into the reaction chamber, and the flow rate of the etching gas is constant. When the process starts, the bias power supply is turned on to apply the bias power to the substrate, the bias power supply may be an excitation power supply with 13.56 MHz, or may be a low-frequency pulsed excitation power supply or other power supply. During the process is performed, the deposition operation is inserted into sometimes, that is, the deposition gas is supplied into the reaction chamber discontinuously, the deposition gas may be $C_4F_8$ gas and the bias power supply is turned off when starting supplying $C_4F_8$ gas. When the deposition operation is finished, $C_4F_8$ gas is switched off and meanwhile, the bias power supply is turned on. From the above, the switching on of $C_4F_8$ gas and the turning on of the bias power supply are alternately performed, which is repeated until the whole etching process of the substrate to be processed is completed. By keeping the etching plasma to exist when the deposition operation is performed, at least a part of deposited polymers formed by the deposition operation on a sidewall of an etched section are etched away.

Figure 3:
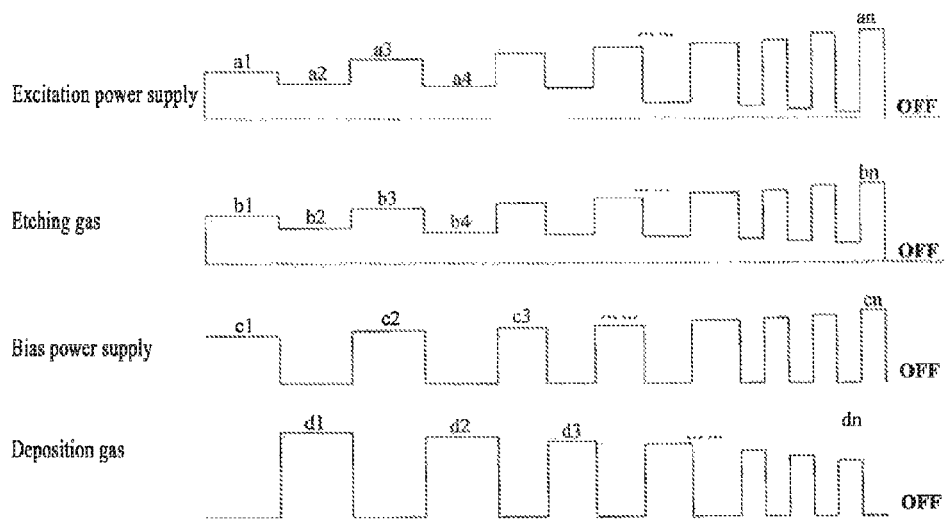
FIG. 3 is a timing diagram illustrating ON/OFF of an excitation power supply, an etching gas, a bias power supply and a deposition gas according to another embodiment of the invention.

FIG. 3 is a timing diagram illustrating ON/OFF of the excitation power supply, the etching gas, the bias power supply and the deposition gas according to another embodiment of the invention. In conjunction with FIG. 3, the description is made taking the deep silicon etching process as an example. When performing the deep silicon etching process, the excitation power supply is used to generate high density plasma, the radio frequency (RF) of the excitation power supply is 13.56 MHz, or may be 27.12 MHz, 40 MHz or other frequency, and the power of the excitation power supply is 1000 W to 6000 W, preferably 2000 W to 5000 W. During the whole process, the etching operation is always performed, that is, the excitation power supply which generates the high density plasma is always kept to be turned on and always supplies etching gas ($SF_6$ gas) into the reaction chamber, and the flow rate of the etching gas is variable. During the process is performed, the deposition operation is inserted into sometimes, that is, the bias power supply is turned on discontinuously and the deposition gas ($C_4F_8$ gas) is supplied into the reaction chamber discontinuously, The switching on of $C_4F_8$ gas and the turning on of the bias power supply are alternately performed, which is repeated until the whole etching process of the substrate to be processed is completed.

According to another embodiment of the invention, the etching effect may be further increased by adjusting at least some process conditions among the process conditions such as the flow rate of the etching gas, the power of the excitation power supply, the power of the bias power supply, the flow rate of the deposition gas and the frequency of ON/OFF of the bias power supply.

For example, in some examples of the invention, during the whole substrate etching process, the process parameters such as the power of the excitation power supply, the flow rate of the etching gas, the power of the bias power supply and the flow rate of the deposition gas may be controlled as follows with the progress of the process (i.e. with the increase of the etching depth). For example, during each period in which the bias power supply is turned on (i.e. during each period in which the combined operation mode is performed), the power of the bias power supply, the flow rate of the etching gas, and/or the power of the excitation power supply may be kept constant or be increased gradually; and/or during each period in which the bias power supply is turned off (i.e. during each period in which the single operation mode is performed), the flow rate of the deposition gas, the flow rate of the etching gas, and/or the power of the excitation power supply may be kept constant or decreased gradually.

For another example, during two adjacent periods in which the bias power supply is turned on (i.e. during each period in which the combined operation mode is performed), the power of the bias power supply, the flow rate of the etching gas and/or the power of the excitation power supply during the latter period in which the bias power supply is turned on are equal to or larger than those during the former period in which the bias power supply is turned on; and/or during two adjacent periods in which the bias power supply is turned off (i.e. during each period in which the single operation mode is performed), the flow rate of the deposition gas, the flow rate of the etching gas and/or the power of the excitation power supply during the latter period in which the bias power supply is turned off are equal to or smaller than those during the former period in which the bias power supply is turned off. For another example, the above two controlling manners can be combined.

The following description will be made by referring to FIG. 3. Particularly, referring to FIG. 3, during the bias power supply is turned on for the first time (the power of the bias power supply is c1), the power of the excitation power supply is a1, and the flow rate of the etching gas is b1; during the bias power supply is turned off for the first time (supply of the deposition gas is started while the bias power supply is turned off, and the flow rate of the deposition gas is d1), the power of the excitation power supply is a2, and the flow rate of the etching gas is b2; during the bias power supply is turned on for the second time (the power of the bias power supply is c2), the power of the excitation power supply is a3 and the flow rate of the etching gas is b3; during the bias power supply is turned off for the second time (supply of the deposition gas is started while the bias power supply is turned off, and the flow rate of the deposition gas is d2), the power of the excitation power supply is a4 and the flow rate of the etching gas is b4.

From FIG. 3, with the progress of the process, during each period the bias power supply is turned on or tuned off, both the power of the excitation power supply and the flow rate of the etching gas are kept to be constant. Moreover, as for the power of the excitation power supply, a3>a1>a2>a4; as for the flow rate of the etching gas, b3>b1>b2>b4, as for the power of the bias power supply, cn> . . . >c3>c2>c1 and as for the flow rate of the deposition gas, dn< . . . <d3<d3<d1. From a3>a1, b3>b1 and c2>c1, it can be seen that, the flow rate of the etching gas, the power of the excitation power supply and the power of the bias power supply during the period in which the bias power supply is turned on for the second time is larger than those during the period in which the bias power supply is turned on for the first time, and from a2>a4, b2>b4 and d1>d2, it can be seen that, the flow rate of the etching gas, the power of the excitation power supply and the power of the bias power supply during the period in which the bias power supply is turned on for the second time is larger than those during the period in which the bias power supply is turned on for the first time. And so on, with the progress of the process, during two adjacent periods in which the bias power supply is turned on, the flow rate of the etching gas, the power of the excitation power supply and the power of the bias power supply during the latter period in which the bias power supply is turned on are larger than those during the former period in which the bias power supply is turned on, and during two adjacent periods in which the bias power supply is turned off, the flow rate of the deposition gas, the flow rate of the etching gas and the power of the excitation power supply during the latter period in which the bias power supply is turned off are smaller than those during the former period in which the bias power supply is turned off. Other steps according to the embodiment of the invention are equal to those of the embodiment illustrated in FIG. 1 and will not be elaborated herein.

In a further example of the invention, during the whole substrate etching process, with the progress of the process, the switching frequency of ON/OFF of the bias power supply may be changed gradually (that is, the period between turning on and turning off of the bias power supply is changed), and correspondingly the switching frequency of switching on and switching off of the deposition gas is changed (that is, the period between stopping feeding the deposition gas and starting feeding the deposition gas is changed). In addition, with the progress of process, the switching frequency of power levels of the excitation power supply may be gradually increased, and/or the switching frequency of flow rates of the etching gas may be gradually increased. For example, as shown in FIG. 3, during the whole substrate etching process, with the progress of the process, the switching frequency of turning on and turning off of the bias power supply may be gradually increased, and correspondingly, the switching frequency of switching on and switching off of the deposition gas, the switching frequency of power levels of the excitation power supply and the switching frequency of flow rates of the etching gas are increased. Other steps according to the embodiment of the invention are equal to those of the embodiment illustrated in FIG. 1 and will not be elaborated herein.

Although FIG. 3 illustrates the case that the plurality of process conditions may be changed simultaneously during the etching process, it should be understood that, in practical application, one or several process conditions among the plurality of process conditions may be changed.

In an embodiment of the invention, when the bias power supply is turned on, impedance matching between the excitation power supply and the bias power supply may be achieved rapidly by using the fixed matching method or the method combining fixed matching and frequency scanning as mentioned above.

Figure 4:
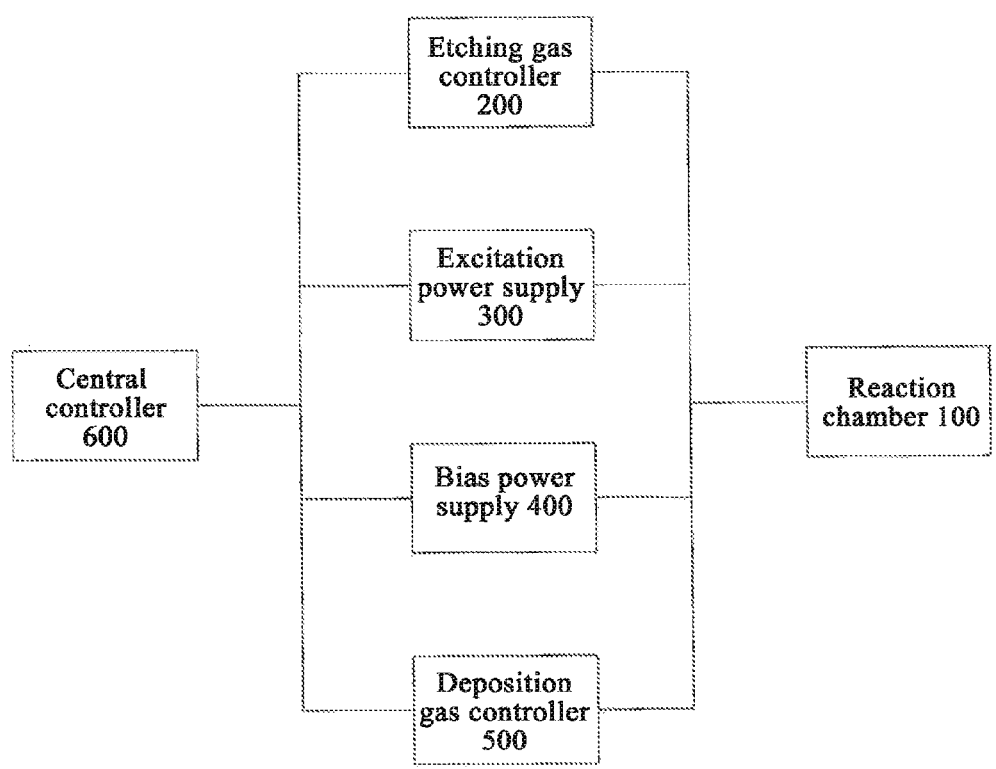
FIG. 4 is a diagram illustrating a structure of a substrate processing device according to an embodiment of the invention.

FIG. 4 is a diagram illustrating a structure of a substrate processing device according to an embodiment of the invention. The substrate processing device includes a reaction chamber 100, an etching gas controller 200, an excitation power supply 300, a bias power supply 400, a deposition gas controller 500 and a central controller 600. Herein, the central controller 600 is connected to the etching gas controller 200, the excitation power supply 300, the bias power supply 400 and the deposition gas controller 500, respectively. The etching gas controller 200 is used to switch on or switch off an etching gas path for supplying etching gas into the reaction chamber and to adjust flow rate of the etching gas. The excitation power supply 300 is used to apply radio frequency power to the etching gas in the reaction chamber 100 to generate plasma in the reaction chamber 100. The bias power supply 400 is used to apply bias power to a substrate to be processed. The deposition gas controller 500 is used to switch on or switch off a deposition gas path for supplying deposition gas into the reaction chamber and to adjust the flow rate of the deposition gas. The central controller 600 is used to perform at least the following operations: controlling the etching gas controller 200 to switch on or switch off the etching gas path and adjusting the flow rate of the etching gas; controlling turning-on or turning-off of the excitation power supply 300 and adjusting the radio frequency power of the excitation power supply 300; controlling turning-on or turning-off of the bias power supply 400, and adjusting the bias power of the bias power supply 400; and controlling the deposition gas controller 500 to switch on or switch off the deposition gas path and adjusting the flow rate of the deposition gas.

It should be understood that, the central controller 600 may be implemented in hardware or software, which is known to persons skilled in the art and will not elaborated herein.

In an embodiment of the invention, the central controller 600 performs the following operations throughout the substrate etching process: controlling the excitation power supply 300 to be kept in a turn-on state, controlling the etching gas controller 200 to keep the etching gas path in a turn-on state, controlling to switch off the deposition gas path while turning on the bias power supply 400, and controlling to switch on the deposition gas path while turning off the bias power supply 400.

In an embodiment of the invention, throughout the whole substrate etching process, with the progress of process (i.e. with the increase of the etching depth), the central controller 600 may control process parameters such as the power of the excitation power supply 300, the flow rate of the etching gas, the power of the bias power supply 400 and the flow rate of the deposition gas in the following manners. For example, the central controller 600 controls the etching gas controller 200 to adjust the flow rate of the etching gas, and/or the central controller 600 controls the power of the excitation power supply 300 and/or the power of the bias power supply so that during each period in which the bias power supply 400 is turned on, the flow rate of the etching gas, the power of the excitation power supply 300 and/or the power of the bias power supply 400 are kept constant or increased gradually; and/or the central controller 600 controls the etching gas controller 200 to adjust the flow rate of the etching gas, the central controller 600 controls the deposition gas controller 500 to adjust the flow rate of the deposition gas, and/or the central controller 600 controls the power of the excitation power supply 300 so that during each period in which the bias power supply 400 is turned off, the flow rate of the etching gas, the flow rate of the deposition gas, and/or the power of the excitation power supply 300 are kept constant or decreased gradually.

For another example, with the progress of process, the central controller 600 controls the etching gas controller 200 to adjust the flow rate of the etching gas, and/or the central controller 600 controls the power of the excitation power supply 300 and/or the power of the bias power supply 400 so that during two adjacent periods in which the bias power supply 400 is turned on, the flow rate of the etching gas, the power of the excitation power supply 300, and/or the power of the bias power supply 400 during the latter period in which the bias power supply 400 is turned on are equal to or larger than those during the former period in which the bias power supply 400 is turned on; and/or the central controller 600 controls the etching gas controller 200 to adjust the flow rate of the etching gas, the central controller 600 controls the deposition gas controller 500 to adjust the flow rate of the deposition gas, and/or the central controller 600 controls the power of the excitation power supply 300 so that during two adjacent periods in which the bias power supply 400 is turned off, the flow rate of the etching gas, the flow rate of the deposition gas and/or the power of the excitation power supply 300 during the latter period in which the bias power supply 400 is turned off are equal to or smaller than those during the former period in which the bias power supply 300 is turned off. For another example, the central controller 600 may control by combining the above two controlling methods.

In an embodiment of the invention, throughout the whole substrate etching process, the central controller 600 controls the switching frequency of ON/OFF of the bias power supply 400 to be increased gradually with the progress of process, and the central controller 600 controls the deposition gas controller 500 so that the switching frequency of connection/disconnection of the deposition gas path is increased as the switching frequency of ON/OFF of the bias power supply 400 is increased.

According to embodiments of the invention, the etching operation is kept to be always performed throughout the whole substrate etching process and the deposition operation is sometimes inserted into the substrate etching process so that a single etching operation mode and a combined operation mode, in which the etching operation and the deposition operation are performed simultaneously, are circulated alternately. When the combined operation mode is performed, the substrate is etched by plasma in the reaction chamber while the deposition operation is performed so that at least a part of deposited polymers formed by the deposition operation on a sidewall of an etched section are etched away, to make the sidewall of the etched section of the substrate smooth, increasing process quality of the substrate.

Moreover, compared with the existing Bosch process in which the etching operation and the deposition operation are performed alternately, by supplying etching gas into the reaction chamber and keeping the excitation power supply to be in a turn-on state throughout the whole substrate etching process, the process parameters (such as power of the excitation power supply, kinds of gas, etching gas and gas pressure) may be adjusted conveniently during the substrate etching process and the substrate etching process can reach a stable state rapidly, thus increasing the process performance.

In addition, in the embodiments of the present invention, different process parameters can be adjusted synchronously, for example, feeding of deposition gas and turning off of the bias power supply may be performed synchronously; as another example, stop feeding of deposition gas and turning on of the bias power supply may be performed synchronously. Compared with the existing Bosch process in which different process parameters can be adjusted sequentially, the invention can save time required to adjust process parameters, thus increasing process efficiency.

In the description, terms "an embodiment", "embodiments", "examples" or "particular examples" etc. means that particular features, structures, materials or characteristics described in conjunction with the embodiment or example are includes in the at least one embodiment or example of the invention. In the description, illustrative expressions of the above terms do no exactly indicate identical embodiments or examples. Moreover, the described particular features, structures, materials or characteristics may be combined into any one or more embodiments or examples in any proper way.

Although embodiments of the invention have been illustrated and described, it should be understood for persons skilled in the art that, various modifications, changes, substitutions and variations may be made to these embodiments without departing from the spirit and essence of the present invention and the protection scope of the present invention is defined by the appended claims and the equivalents thereof.

The invention claimed is:

1. A substrate etching method, including:
   S1: placing a substrate to be processed into a reaction chamber;
   S2: always supplying etching gas into the reaction chamber;
   S3: turning on an excitation power supply to generate plasma in the reaction chamber;
   S4: turning on a bias power supply to apply bias power to the substrate;
   S5: turning off the bias power supply, and meanwhile, starting to supply deposition gas into the reaction chamber;
   S6: stopping supply of the deposition gas into the reaction chamber, and meanwhile, turning on the bias power supply; and
   S7: repeating steps S5-S6, whereby a single etching operation is alternated with a combined operation in which the etching operation and a deposition operation are performed simultaneously until the etching process is completed.

2. The substrate etching method of claim 1, wherein with the progress of process,
   during each period in which the bias power supply is turned on, the power of the bias power supply, the flow rate of the etching gas, and/or the power of the excitation power supply are kept constant or increased gradually; and/or
   during each period in which the bias power supply is turned off, the flow rate of the deposition gas, the flow rate of the etching gas, and/or the power of the excitation power supply are kept constant or decreased gradually.

3. The substrate etching method of claim 1, wherein with the progress of process,
   as for two adjacent periods in which the bias power supply is turned on, the power of the bias power supply, the flow rate of the etching gas and/or the power of the excitation power supply during the latter period are equal to or larger than those during the former period; and/or
   as for two adjacent periods in which the bias power supply is turned off, the flow rate of the deposition gas, the flow rate of the etching gas and/or the power of the excitation power supply during the latter period are equal to or smaller than those during the former period.

4. The substrate etching method of claim 1, wherein with the progress of process, the switching frequency of ON/OFF of the bias power supply is increased gradually, and the switching frequency of connection/disconnection of the deposition gas is increased correspondingly.

5. The substrate etching method of claim 4, wherein with the progress of process, the switching frequency of power levels of the excitation power supply is gradually increased, and/or the switching frequency of flow rates of the etching gas is gradually increased.

6. The substrate etching method of claim 1, wherein when the bias power supply is turned on, impedance matching of the excitation power supply and the bias power supply is achieved respectively by using a fixed matching method or a method combining fixed matching and frequency scanning.

7. The substrate etching method of claim 1, the excitation power supply is a radio frequency power supply.

8. The substrate etching method of claim 1, wherein the etching gas is at least one of fluorine based etching gas, chlorine based etching gas, and bromine based etching gas.

9. The substrate etching method of claim 8, wherein the fluorine based etching gas includes $CF_4$ and $SF_6$, the chlorine based etching gas includes $Cl_2$, $BCl_3$, $SiCl_4$, $SiCl_2H_2$, and the bromine based etching gas includes $Br_2$ and HBr.

10. The substrate etching method of claim 1, wherein the deposition gas is at least one of $C_4F_8$, $C_2F_4$, $C_2H_2F_2$ and $CCl_4$.

11. A substrate processing device, including:
    a reaction chamber;
    an etching gas controller, for switching on or switching off an etching gas path for supplying etching gas into the reaction chamber and adjusting flow rate of the etching gas;
    an excitation power supply, for applying radio frequency power to the etching gas in the reaction chamber to generate plasma in the reaction chamber;
    a bias power supply, for applying bias power to a substrate;
    a deposition gas controller, for switching on or switching off a deposition gas path for supplying deposition gas into the reaction chamber and adjusting the flow rate of the deposition gas; and
    a central controller, connected with the etching gas controller, the excitation power supply, the bias power supply and the deposition gas controller, respectively, and for performing at least the following operations:
    controlling the etching gas controller to switch on or switch off the etching gas path and adjusting the flow rate of the etching gas;
    controlling turning-on or turning-off of the excitation power supply and adjusting the radio frequency power of the excitation power supply;
    controlling turning-on or turning-off of the bias power supply, and adjusting the bias power of the bias power supply; and
    controlling the deposition gas controller to switch on or switch off the deposition gas path and adjusting the flow rate of the deposition gas;
    wherein throughout the substrate etching process, the central controller controls the excitation power supply to be kept in a turn-on state, controls the etching gas controller to keep the etching gas path in a switch-on state, controls the deposition gas path to be switched off while the bias power supply is turned on, and controls the deposition gas path to be switched on while the bias power supply is turned off causing an alternating of a single etching operation with a combined operation in which the etching operation and a deposition operation are performed simultaneously.

12. The substrate processing device of claim 11, wherein with the progress of process, the central controller controls the etching gas controller to adjust the flow rate of the etching gas, and/or the central controller controls the power of the excitation power supply and/or the power of the bias power supply so that during each period in which the bias power supply is turned on, the flow rate of the etching gas, the power of the excitation power supply and/or the power of the bias power supply are kept constant or increased gradually; and/or
    the central controller controls the etching gas controller to adjust the flow rate of the etching gas, the central controller controls the deposition gas controller to adjust the flow rate of the deposition gas, and/or the central controller controls the power of the excitation power supply so that during each period in which the bias power supply is turned off, the flow rate of the etching gas, the flow rate of the deposition gas, and/or the power of the excitation power supply are kept constant or decreased gradually.

13. The substrate processing device of claim 12, wherein with the progress of process, the central controller controls the etching gas controller to adjust the flow rate of the etching gas, and/or the central controller controls the power of the excitation power supply and/or the power of the bias power supply so that during two adjacent periods in which the bias power supply is turned on, the flow rate of the etching gas, the power of the excitation power supply, and/or the power of the bias power supply during the latter period are equal to or larger than those during the former period; and/or the central controller controls the etching gas controller to adjust the flow rate of the etching gas, the central controller controls the deposition gas controller to adjust the flow rate of the deposition gas, and/or the central controller controls the power of the excitation power supply so that during two adjacent periods in which the bias power supply is turned off, the flow rate of the etching gas, the flow rate of the deposition gas and/or the power of the excitation power supply during the latter period are equal to or smaller than those during the former period.

14. The substrate processing device of claim 12, wherein the central controller controls the switching frequency of ON/OFF of the bias power supply to be increased gradually with the progress of process, and the central controller controls the deposition gas controller so that the switching frequency of connection/disconnection of the deposition gas path is increased as the switching frequency of ON/OFF of the bias power supply is increased.

15. The substrate processing device of claim 14, wherein the central controller controls the switching frequency of ON/OFF of the excitation power supply to be increased gradually with the progress of process; and/or the central controller controls the etching gas controller so that the switching frequency of connection/disconnection of the etching gas path is increased with the progress of process.

16. The substrate processing device of claim 11, wherein when the bias power supply is turned on, the central controller controls impedance matching of the excitation power supply and the bias power supply, respectively, and a method to achieve the impedance matching is a fixed matching method or a method combining fixed matching and frequency scanning.

17. The substrate processing device of claim 11, wherein the excitation power supply is a radio frequency power supply.

* * * * *